(12) United States Patent
Lee et al.

(10) Patent No.: US 9,868,634 B2
(45) Date of Patent: Jan. 16, 2018

(54) METHOD FOR MANUFACTURING STAMP AND METHOD FOR MANUFACTURING WIRE GRID POLARIZER USING THE STAMP

(71) Applicant: Samsung Display Co. Ltd., Yongin, Gyeonggi-Do (KR)

(72) Inventors: Dae Young Lee, Seoul (KR); Hyun Bin Cho, Seongnam-si (KR); Eun Jung Kim, Suwon-si (KR); Gug Rae Jo, Asan-si (KR)

(73) Assignee: SAMSUNG DISPLAY CO. LTD. (KR)

( * ) Notice: Subject to any disclaimer, the term of this patent is extended or adjusted under 35 U.S.C. 154(b) by 0 days.

(21) Appl. No.: 14/682,501

(22) Filed: Apr. 9, 2015

(65) Prior Publication Data
US 2016/0200033 A1    Jul. 14, 2016

(30) Foreign Application Priority Data
Jan. 8, 2015   (KR) ........................ 10-2015-0002564

(51) Int. Cl.
*B81C 99/00*   (2010.01)
*B29C 59/00*   (2006.01)
*G03F 7/00*    (2006.01)
*G02B 5/30*    (2006.01)
*G02B 27/28*   (2006.01)
*B29L 11/00*   (2006.01)
*B29C 33/42*   (2006.01)

(52) U.S. Cl.
CPC .......... *B81C 99/009* (2013.01); *B29C 59/002* (2013.01); *G02B 5/3058* (2013.01); *G02B 27/286* (2013.01); *G03F 7/0002* (2013.01); *B29C 33/42* (2013.01); *B29L 2011/0066* (2013.01)

(58) Field of Classification Search
None
See application file for complete search history.

(56) References Cited

U.S. PATENT DOCUMENTS 6,813,077 B2 * 11/2004 Borrelli ................ G02B 6/2746
                                                216/24
2008/0094547 A1    4/2008 Sugita et al.
(Continued)

FOREIGN PATENT DOCUMENTS

JP    2011-227243    11/2011
KR    10-2009-0001371    1/2009
(Continued)

*Primary Examiner* — Jiong-Ping Lu
(74) *Attorney, Agent, or Firm* — Innovation Counsel LLP

(57) ABSTRACT

A method for manufacturing at least one stamp may include preparing a mold that includes mold protrusions, wherein the mold protrusions extend parallel to each other in a plan view of the mold and include a first mold protrusion. The method may further include providing resin on the mold, wherein the resin partially covers the mold protrusions without completely covering the mold protrusions, and wherein a side of the resin is at an angle with respect to the first mold protrusion in a plan view of a structure that includes the mold and the resin. The method may further include curing the resin to form cured resin. The method may further include forming a stamp that includes the cured resin.

16 Claims, 20 Drawing Sheets

(56) References Cited

U.S. PATENT DOCUMENTS

| | | | |
|---|---|---|---|
| 2008/0299467 A1* | 12/2008 | Kim | B82Y 10/00 |
| | | | 430/5 |
| 2009/0052030 A1 | 2/2009 | Kaida et al. | |
| 2011/0217409 A1* | 9/2011 | Rudin | B82Y 10/00 |
| | | | 425/470 |
| 2011/0285942 A1 | 11/2011 | Guo et al. | |
| 2013/0335815 A1* | 12/2013 | Kim | G02B 5/1809 |
| | | | 359/352 |

FOREIGN PATENT DOCUMENTS

| | | |
|---|---|---|
| KR | 10-2011-0101893 | 9/2011 |
| KR | 10-2013-0052942 | 5/2013 |
| KR | 10-2013-0120420 | 11/2013 |
| KR | 10-2014-0074427 | 6/2014 |

* cited by examiner

METHOD FOR MANUFACTURING STAMP AND METHOD FOR MANUFACTURING WIRE GRID POLARIZER USING THE STAMP

CROSS-REFERENCE TO RELATED APPLICATIONS

This application claims priority to and benefit of Korean Patent Application No. 10-2015-0002564 filed on Jan. 8, 2015 in the Korean Intellectual Property Office; the Korean Patent Application is incorporated herein in its entirety by reference.

BACKGROUND

1. Field of the Invention

The present invention is related to a method for manufacturing a stamp and is related to a method for manufacturing a wire grid polarizer using the stamp.

2. Description of Related Art

A wire grid polarizer may include an array of parallel wires. A polarization component that is parallel to the wires length direction may be reflected and/or absorbed. A polarization component that is perpendicular to the wires may be transmitted.

The wires may be formed using a lithography process, such as an electron beam lithography process or an optical lithography process. Nevertheless, the productivity associated with the electron beam lithography process may be undesirably low, and the cost associated with the optical lithography process may be undesirably high.

The wires may be formed using a nano-imprint process. In general, different sets of equipment and different processes may be required for manufacturing wire grid polarizers that have different polarization directions.

SUMMARY

An embodiment of the present invention may be related to a method for manufacturing at least one stamp. The stamp may be used in manufacturing one or more wire grid polarizers for use in one or more display panels, such as one or more liquid crystal display panels. The method may include the following steps: preparing a mold that includes mold protrusions, wherein the mold protrusions extend parallel to each other in a plan view of the mold and include a first mold protrusion; providing first resin on the mold, wherein the first resin may partially cover the mold protrusions without completely covering the mold protrusions, and wherein a first side of the first resin may be at a first angle with respect to the first mold protrusion in a plan view of a structure that includes the mold and the first resin; curing the first resin to form first cured resin; and forming a first stamp that includes the first cured resin.

The method may include the following steps: providing second resin on the mold, wherein the second resin may partially cover the mold protrusions without completely covering the mold protrusions, wherein a first side of the second resin may be at a second angle with respect to the first mold protrusion in a plan view of a structure that includes the mold and the second resin, and wherein the second angle may be unequal to the first angle; curing the second resin to form second cured resin; and forming a second stamp that includes the second cured resin.

The method may include the following step: rotating the mold before providing the second resin on the mold.

The first side of the first resin may be longer than a second side of the first resin in a plan view of the first resin. The first side of the second resin may be longer than a second side of the second resin in a plan view of the second resin.

An area of the first cured resin in a plan view of the first cured resin may be equal to an area of the second cured resin in a plan view of the second cured resin.

A difference between the second angle and the first angle may be equal to 90 degrees.

The first angle may be an acute angle or an obtuse angle. The first angle may be an acute angle, and the second angle may be an obtuse angle.

The first resin may be positioned between two portions of the first mold protrusion in the plan view of the structure that includes the mold and the first resin.

The first resin may be positioned between two arcs of the mold in a plan view of a structure that includes the mold and the first resin.

An embodiment of the present invention may be related to a method for manufacturing at least one wire grid polarizer. The wire grid polarizer may be used in a display panel, such as a liquid crystal display panel. The method may include the following steps: preparing a mold that includes mold protrusions, wherein the mold protrusions extend parallel to each other in a plan view of the mold and include a first mold protrusion; providing first resin on the mold, wherein the first resin may partially cover the mold protrusions without completely covering the mold protrusions, and wherein a first side of the first resin may be at a first angle with respect to the first mold protrusion in a plan view of a structure that includes the mold and the first resin; curing the first resin to form first cured resin; forming a first stamp that includes the first cured resin; pressing the first stamp on first mask material for forming a first mask; and etching a first metal film through the first mask to form wires of a first wire grid polarizer.

The method may include the following steps: providing second resin on the mold, wherein the second resin may partially cover the mold protrusions without completely covering the mold protrusions, wherein a first side of the second resin may be at a second angle with respect to the first mold protrusion in a plan view of a structure that includes the mold and the second resin, and wherein the second angle may be unequal to the first angle; curing the second resin to form second cured resin; forming a second stamp that includes the second cured resin; pressing the second stamp on second mask material for forming a second mask; and etching a second metal film through the second mask to form wires of a second wire grid polarizer.

The method may include the following step: rotating the mold before providing the second resin on the mold.

The first side of the first resin may be longer than a second side of the first resin in a plan view of the first resin. The first side of the second resin may be longer than a second side of the second resin in a plan view of the second resin.

A length of a wire of the wires of the second wire grid polarizer may be substantially equal to a length of the first side of the first resin.

A first side of the first cured resin may be longer than a second side of the first cured resin in a plan view of the first cured resin. A length of the first side of the first cured resin may be equal to a length of a wire of the wires of the second wire grid polarizer. A first side of the second cured resin may be longer than a second side of the second cured resin in a plan view of the second cured resin. A length of the second side of the second cured resin may be equal to a length of a wire of the wires of the first wire grid polarizer.

A first side of the first cured resin may be longer than a second side of the first cured resin in a plan view of the first cured resin. A wire of the wires of the second wire grid polarizer may be shorter than the first side of the first cured resin and may be longer than the second side of the first cured resin.

The mold may include a silicon member.

The first resin may be positioned between two arcs of the first mold protrusion in the plan view of the structure that includes the mold and the first resin.

The first mask may include the first mask material and a resistance layer. The resistance layer may be positioned between the first mask material and the first metal film.

An embodiment of the present invention may be related to a method for manufacturing a master mold (i.e., a master stamp). The method may include the following steps: forming micro-patterns in the form of stripes that are spaced apart from each other on one surface of a mold having a circular plate shape; positioning the mold at a first angle with respect to a reference; and spreading resin in rectangular regions on the micro-patterns of the mold, wherein the first angle of the mold is determined so that a length direction of the micro-patterns of the mold is set to any one of a vertical direction, a horizontal direction, and an inclined direction with respect to the reference.

The method for manufacturing a master mold may further include arranging the mold such that the mold is positioned at a second angle different from the first angle with respect to the reference. The mold may be rotated about a circular center of the mold.

The inclined direction may be a direction that corresponds to an angle that is formed between the vertical direction and the horizontal direction.

An embodiment of the present invention may be related to a method for manufacturing a wire grid polarizer. The method may include the following steps: forming micro-patterns in the form of stripes that are spaced apart from each other on one surface of a mold having a circular plate shape; positioning the mold at a first angle with respect to a reference; spreading first resin in rectangular regions on the micro-patterns of the mold; forming a first film stamp by transferring the first resin to a film; and imprinting the first film stamp onto a first mother substrate on which first mask material is spread.

The first mother substrate may include a glass substrate and a metal thin film that is deposited on the glass substrate, and the first mask material is spread on the metal thin film.

The method for manufacturing a wire grid polarizer may further include performing etching the metal thin film through the first mask material, which has been stamped by the first film stamp.

A hard mask layer may be provided between the metal thin film and the first mask material to form a composite mask that has desirable etch resistance.

The metal film may include aluminum (Al).

The hard mask layer may include at least one of chrome and nitrogen.

The first angle of the mold may be determined so that a length direction of the micro-patterns of the mold is set to any one of a vertical direction, a horizontal direction, and an inclined direction with respect to the reference.

The method for manufacturing a wire grid polarizer may further include rotating the mold such that the mold may be positioned at a second angle different from the first angle with respect to the reference. The mold may be rotated about a circular center of the mold.

The inclined direction may be a direction that corresponds to an angle that is formed between the vertical direction and the horizontal direction.

The method for manufacturing a wire grid polarizer may further include positioning the mold at a second angle with respect to the reference; spreading second resin in rectangular regions on the micro-patterns of the mold; forming a second film stamp by transferring the second resin to a film; and imprinting the second film stamp onto a second mother substrate on which second mask material is spread.

The mold may be rotated to become orthogonal with respect to the reference.

The method for manufacturing a wire grid polarizer may further include performing a laminate process by heating the micro-patterns of the mold at high temperature and at high pressure after making the micro-patterns in close contact with the first film stamp in the transferring the first resin to the film.

The first mask material may be spread in a plurality of regions, which correspond to display regions of display panels and are spaced from one another at predetermined intervals, on the first mother substrate.

The mold may include silicon (Si).

The respective regions, to which patterns of the first film stamp are transferred, may have areas that are equal to areas of the respective regions, on which the first mask material is spread on the first mother substrate.

The respective regions may be arranged in an array structure.

According to embodiments of the present invention, wire grid polarizers having different pattern directions can be manufactured using the same mold. Advantageously, the manufacturing cost associated with the wire grid polarizers may be minimized.

The above summary is related to some of many embodiments of the invention disclosed herein and is not intended to limit the scope of the invention.

DETAILED DESCRIPTION OF EMBODIMENTS OF THE INVENTION

Figure 1:
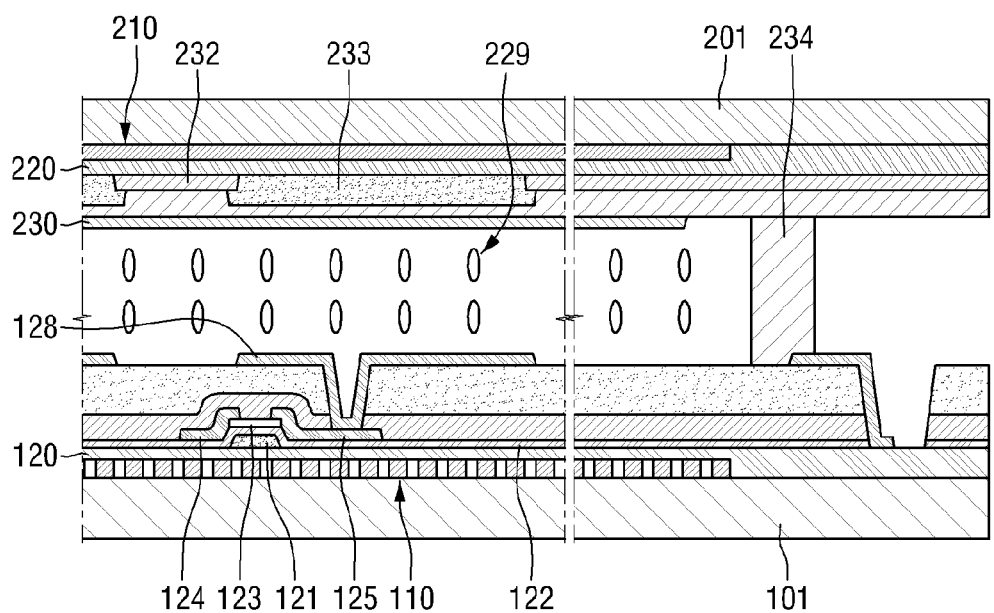
FIG. 1 is a schematic cross-sectional view illustrating two wire grid polarizers included in a display panel according to an embodiment of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

In the drawings, thicknesses of layers may be exaggerated for clarity.

In the description, the term "and/or" may include any and all combinations of associated items.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "below," "lower," "under," "above," "upper" and the like, may be used herein for ease of description to describe the relationship of one element or feature to another element(s) or feature(s) as illustrated in the figures. The spatially relative terms may encompass different orientations of a device or structure in use or operation, in addition to the orientation(s) illustrated in the figures. For example, if a device or structure illustrated in a figure is turned over, elements described as "below" or "beneath" relative to other elements would then be positioned "above" relative to the other elements or features. Thus, the term "below" can encompass both a position of above and below. A device or structure may be otherwise oriented (e.g., rotated by 90 degrees or oriented at other orientations), and the spatially relative descriptors should be interpreted accordingly.

The terminology used herein is for the purpose of describing particular embodiments and is not intended to be limiting of the invention. As used herein, the singular forms "a," "an," and "the" may indicate plural forms as well, unless the context clearly indicates otherwise. The terms "comprises," "comprising," "includes," and/or "including," when used in this specification, specify the presence of stated features, integers, operations, elements, and/or components, but may not preclude the presence or addition of one or more other features, integers, steps, operations, elements, components, and/or groups.

FIG. 1 is a schematic cross-sectional view illustrating two wire grid polarizers 110 and 210 (or polarizers 110 and 210, for conciseness) included in a display panel according to an embodiment of the present invention.

Referring to FIG. 1, the display panel may include a first substrate 101, a second substrate 201, and a liquid crystal layer 229 that is positioned between the substrates 101 and 201. The polarizers 110 and 210 may be respectively positioned on the substrates 101 and 201. The display panel may include a display region and a non-display region. The polarizers 110 and 210 may be positioned in the display region. The polarizers 110 and 210 may perform linear polarization of light.

Each of the polarizers 110 and 210 may include parallel wires, e.g., metal wires. The wires of each of the polarizers 110 and 210 may be parallel to, vertical to, or inclined with respect to a gate line of the display panel in a plan view of the display panel. The wires of the polarizer 110 may be oriented at an angle (e.g., 90 degrees) with respect to the wires of the polarizer 210 in the plan view of the display panel.

A backlight unit may provide light to the display panel. The light may include different light components. Light components that are perpendicular to the wires of a polarizer may be transmitted through the polarizer, and light components that are parallel to the wires of a polarizer may be reflected and/or absorbed by the polarizer. In an embodiment, P-polarized light may be transmitted through the polarizers 110 and 210, and S-polarized light may be reflected and/or absorbed by the polarizers 110 and 210.

Each of a wire width and a wire spacing of each of the polarizers 110 and 210 may be smaller than each of the wavelengths of the red, green, and blue visible lights. In an embodiment, each of the wire width and the wire spacing may be in the range of 50 nm to 200 nm.

The wires of the polarizers 110 and 210 may include a metal having high reflectivity. The wires may be made of one of aluminum, gold, silver, copper, palladium, platinum, rhodium, silicon, cobalt, manganese, titan, ruthenium, niobium, neodymium, ytterbium, yttrium, tungsten, indium, bismuth, chrome, molybdenum, and an alloy of two or more of the aforementioned metal materials. In an embodiment, the wires may be made of aluminum and may have substantially high reflectivity. Each wire may be a single-layer structure or a multilayer that includes layers made of different materials. In an embodiment, each wire may include a lower layer made of aluminum and may include an upper layer made of titanium. In an embodiment, each wire may include a lower layer made of aluminum and may include an upper layer made of molybdenum.

An insulating layer 120 is arranged on the polarizer 110. The polarizer insulating layer 120 may prevent the characteristics of the pixel electrode 128 from being affected by the polarizer 110, which may include metal wires.

A plurality of gate lines (not illustrated) and a plurality of data lines (not illustrated) perpendicular to the gate lines may be positioned on the first substrate 101.

A pixel electrode 128 may be arranged in each pixel that is defined by a gate line and a data line. The pixel electrode 128 may receive a data voltage through a switching element, e.g., a thin film transistor. A gate electrode 121 (i.e., a control terminal) of the thin film transistor may be connected to the gate line, a source electrode 124 (i.e., an input terminal) of the thin film transistor may be connected to the data line, and a drain electrode 125 (i.e., an output terminal) of the thin film transistor may be connected to the pixel electrode 128 through a contact hole (not illustrated). A semiconductor layer 123 may provide a channel of the thin film transistor. The semiconductor layer 123 may overlap the gate electrode 121. The source electrode 124 and the drain electrode 125 may be spaced from each other and may be respectively connected to two opposite edges of the semiconductor layer 123. The pixel electrode 128 may generate an electric field together with the common electrode 230 to control alignment directions of liquid crystal molecules of the liquid crystal layer 229, which is arranged between the pixel electrode 128 and the common electrode 230.

A color filter 233 may be formed for each pixel in the display region of the display panel. The display panel may include red, green, and blue color filters 233. The red, green, and blue color filters 233 may be alternately arranged. Portions of a black matrix 232 may be arranged at boundaries between color filters 233. A portion of the black matrix 232 may be arranged at the non-display region of the display panel. The portion of black matrix 232 in the non-display region may be wider than a portion of the black matrix 232 positioned at a boundary between two color filters 233. The common electrode 230 may substantially cover the display region of the display panel and may overlap pixel electrodes 128.

The first substrate 101 and the second substrate 201 may be bonded by a sealing member 234 that is made of a sealant material. The sealing member 234 may be positioned in the non-display region of the display panel.

Figure 2:
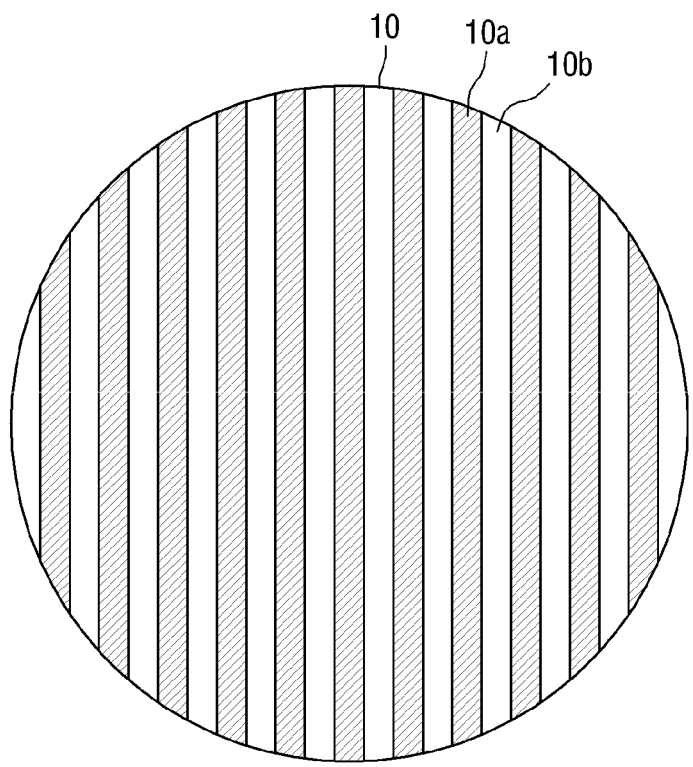
FIG. 2 is a schematic plan view illustrating a mold that may be used for manufacturing a wire grid polarizer according to an embodiment of the present invention.

FIG. 2 is a schematic plan view illustrating a mold 10 that may be used for manufacturing a wire grid polarizer according to an embodiment of the present invention. The mold 10 may include one or more members (e.g., protrusions and/or a base plate that supports the protrusions) made of one or more materials having suitable mechanical characteristics for withstanding pollution and abrasion in repeated replication processed. In an embodiment, the mold 10 may include one or more members made of one or more of a metal material, a glass material, a plastic material, silicon, and a metal oxide material. In an embodiment, the mold 10 may be formed of silicon and may have desirable abrasion resistance, desirable mechanical properties, and/or a desirable transmittance-related property with respect to an ultraviolet (UV) irradiation.

The mold 10 may have a circular plate shape. The mold 10 may include a substantially flat side, may include protrusions 10a (or wires 10a) that overlap the substantially flat side and extend substantially parallel to each other, and may include trenches 10b (or valleys 10b) that are positioned between protrusions 10a and extend substantially parallel to each other. The protrusions 10a and trenches 10b may form a stripe pattern in the plan view of the mold 10.

A first protrusion 10a may pass through the center of the circular shape of the mold 10 in the plan view of the mold 10 and may be longer than other protrusions 10a. The other protrusions 10a may be symmetrically distributed with respect to the first (or longest) protrusion 10a. A second protrusion 10a and a third protrusion 10a may be equally distant from the first protrusion 10a and may be as long as each other. The second protrusion 10a may be positioned between the first protrusion 10a and a fourth protrusion 10a, and the second protrusion 10a may be shorter than the first protrusion 10a and longer than the fourth protrusion 10a.

In an embodiment, a first trench 10b may pass through the center of the circular shape of the mold 10 in a plan view of the mold 10 and may be longer than other trenches 10b. The other trenches 10b may be symmetrically distributed with respect to the first (or longest) trench 10b. A second trench 10b and a third trench 10b may be equally distant from the first trench 10b and may be as long as each other. The second trench 10b may be positioned between the first trench 10b and a fourth trench 10b, and the second trench 10b may be shorter than the first trench 10b and longer than the fourth trench 10b.

In an embodiment, a UV light may be used for curing a set of UV curable resin that is provided on the mold 10, wherein the mold 10 may be formed of a material that has a desirable transmittance during UV irradiation and/or may include a member that has a desirable transmittance during UV irradiation.

In an embodiment, heat may be provided for curing a set of thermosetting resin that is provided on the mold 10, wherein the mold 10 may include one or more members (e.g., protrusions 10a and/or a substrate that supports the protrusions 10a) that may have desirable durability without substantial transparency. The mold 10 may include one or more members formed of one or more of stainless steel, nickel (Ni), copper (Cu), magnesium (Mg), aluminum (Al), chrome (Cr), tungsten (W), molybdenum (Mo), tantalum (Ta), silicon (Si), and a metal oxide.

Figure 3:
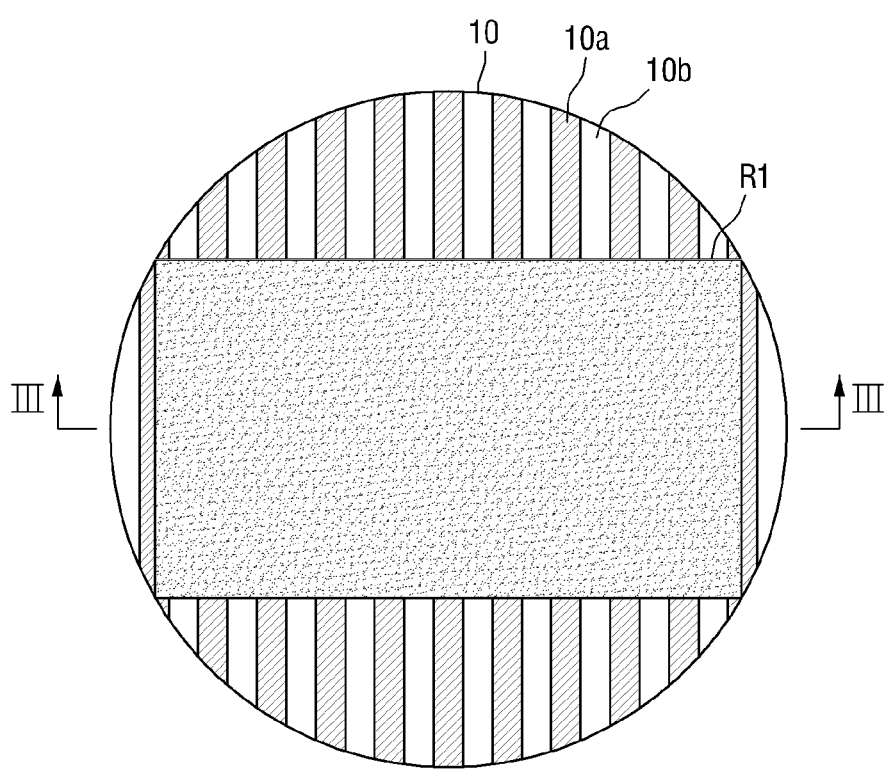
FIG. 3 is a schematic plan view illustrating a step of providing a set of resin on a mold in a method for manufacturing a wire grid polarizer according to an embodiment of the present invention.
Figure 4:
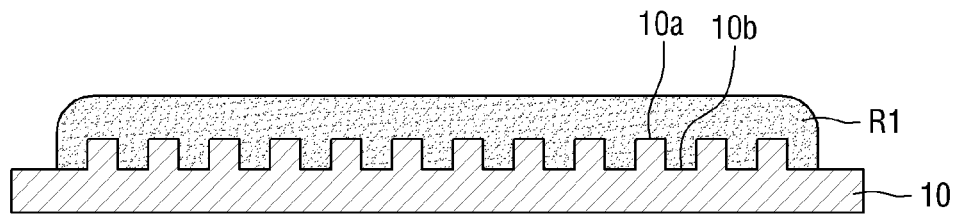
FIG. 4 is a schematic cross-sectional view taken along a line III-III indicated in FIG. 3 according to an embodiment of the present invention.

FIG. 3 is a plan view illustrating a step of providing a set of resin R1 on the mold 10 in a method for manufacturing a wire grid polarizer according to an embodiment of the present invention, and FIG. 4 is a schematic cross-sectional view taken along a line III-III indicated in FIG. 3 according to an embodiment of the present invention.

Referring to FIGS. 3 and 4, the resin R1 is provided (e.g., spread) on the pattern of the mold 10, i.e., on the protrusions 10a and trenches 10b of the mold 10. The resin R1 may have a substantially rectangular shape in the plan view of the structure that includes the mold 10 and the resin R1. An area of the resin R1 in the plan view may be substantially equal to a planar area of the display region of the display panel, a planar area of the first substrate 101, or a planar area of the second substrate 201, wherein the display panel including the substrates 101 and 201 are illustrated in FIG. 1. The mold 10 may be positioned according to a first orientation, wherein the protrusions 10a (and the trenches 10b) may be oriented perpendicular to a longer side of the resin R1 in the plan view. The resin R1 may partially cover the protrusions 10a without completely covering the protrusions 10a. The resin R1 may be positioned between two portions (e.g., two arcs) of a protrusion 10a in the plan view.

Figure 5:
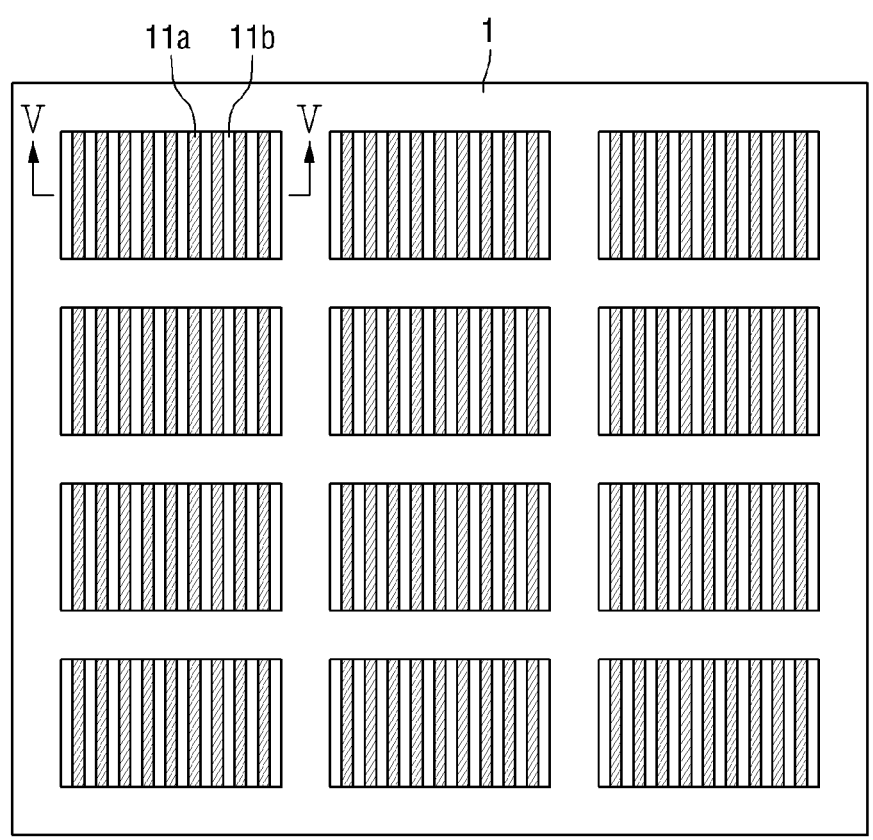
FIG. 5 is a schematic plan view illustrating a film stamp to which the pattern of a mold is transferred according to an embodiment of the present invention.
Figure 6:
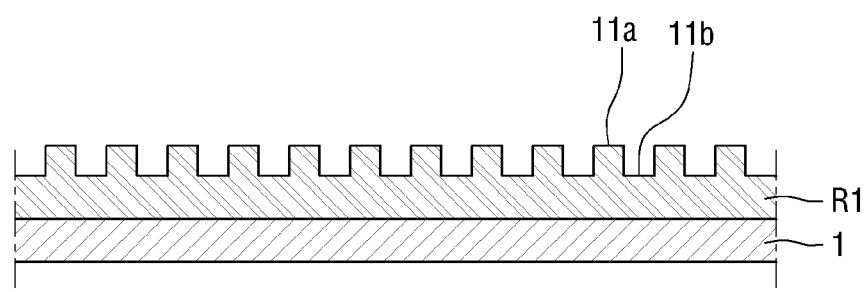
FIG. 6 is a schematic cross-sectional view taken along a line V-V indicated in FIG. 5 according to an embodiment of the present invention.

FIG. 5 is a schematic plan view illustrating a film stamp to which the pattern of the mold 10 is transferred, and FIG. 6 is a schematic cross-sectional view taken along a line V-V indicated in FIG. 5 according to an embodiment of the present invention.

Referring to FIGS. 3, 4, 5, and 6, the pattern that includes the elements 10a and 10b of the mold 10 may be transferred through the resin R1 to a film 1 to form a film stamp. A film 1 may be prepared, and subsequently the first resin R1 may be attached to the film 1 through a lamination process (which may involve a roller). A thermal imprint technique or a UV imprint technique may be used in the lamination process. In an embodiment, the mold 10 is made of an opaque material, a thermosetting material is used as the resin R1, and a thermal imprint process may be performed at a high temperature and at a high pressure to separate the resin R1 from the mold 10 and/or to attach the resin R1 to the film 1. As a result, a film stamp that includes the film 1 and the resin R1 may be formed. The film stamp may include protrusions 11a and trenches 11b of the resin R1. The shapes and dimensions of the protrusions 11a may be determined by the trenches 10b of the mold 10, and the shapes and dimensions of the trenches 11b may be determined by the protrusions 10a of the mold 10.

Figure 7:
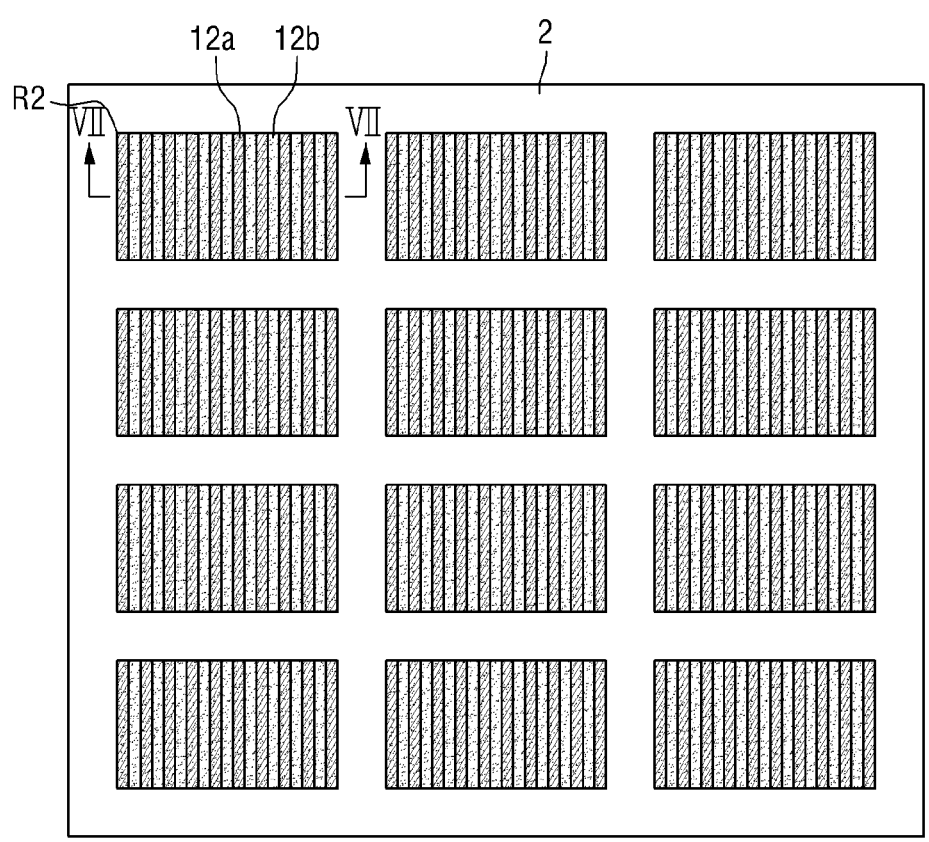
FIG. 7 is a schematic plan view illustrating a mother substrate that is imprinted by the film stamp illustrated in FIG. 5 according to an embodiment of the present invention.
Figure 8:
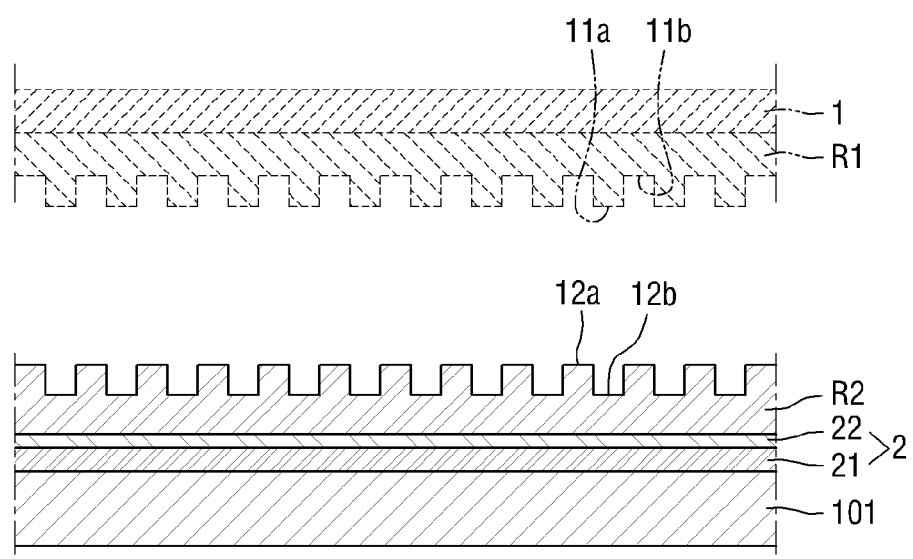
FIG. 8 is a schematic cross-sectional view taken along a line VII-VII indicated in FIG. 7 according to an embodiment of the present invention.

FIG. 7 is a schematic plan view illustrating a mother substrate that is imprinted by the film stamp illustrated in FIG. 5 according to an embodiment of the present invention, and FIG. 8 is a schematic cross-sectional view taken along a line VII-VII indicated in FIG. 7.

Referring to FIGS. 7 and 8, a set of resin R2 is provided (e.g., spread) on each of a plurality of regions on a mother substrate 2. The regions may be arranged in an array that has rows and columns and are spaced from each other. Each set of resin R2 may have a rectangular shape in a plan view and may correspond to a display region of a display panel. Sets of resin R2 are spaced from each other at predetermined intervals. Subsequently, by imprinting the film stamp that includes sets of cured resin R1 onto the mother substrate 2, patterns that replicate the pattern of the mold 10 are transferred to the sets of resin R2, which are positioned at display regions of display panels. As a result, each set of resin R2 may include protrusions 12a and trenches 12b. The shapes and dimensions of the protrusions 12a may be determined by the trenches 11b of the corresponding set of resin R1, and the shapes and dimensions of the trenches 12b may be determined by the protrusions 11a of the corresponding set of resin R1. The shape and area of each set of resin R2 may be substantially identical and equal to the shape and area of a corresponding set of cured set or resin R1 in a plan view of a structure that includes the sets of resins R1 and R2.

Referring to FIG. 8, the mother substrate 2 may include a metal thin film 21. The metal thin film 21 may be disposed on a glass substrate 101. The resin R2 may be spread on the metal thin film 21. The material of the resin R2 may include at least one of a thermosetting resin and a UV curable resin. The resin R2 may be cured. By performing etching on the metal thin film 21 using the cured resin R2 as a mask, metal wires may be formed, and wire grid polarizers may be manufactured. In an embodiment, a hard mask layer 22 may be provided between the metal thin film 21 and the resin R2 to form a composite mask that has a desirable etch resistance, in order to achieve an optimal etching result.

Figure 9:
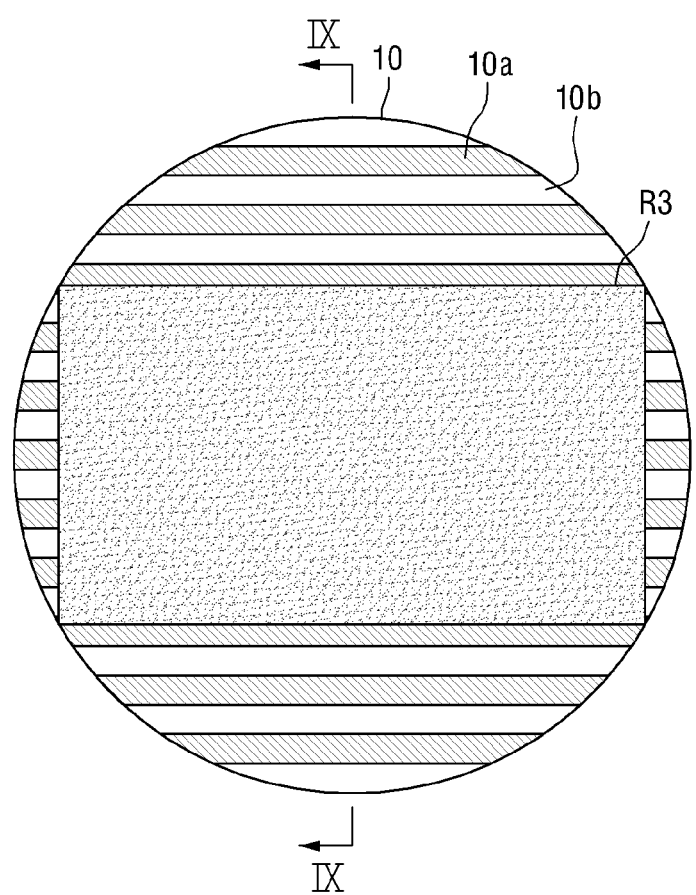
FIG. 9 is a schematic plan view illustrating a step of providing a set of resin on a mold after the mold has been rotated by 90 degrees in a method for manufacturing a wire grid polarizer according to an embodiment of the present invention.
Figure 10:
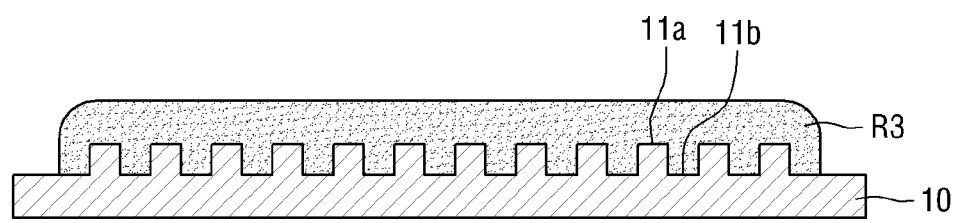
FIG. 10 is a schematic cross-sectional view taken along a line IX-IX indicated in FIG. 9 according to an embodiment of the present invention.

FIG. 9 is a schematic plan view illustrating a step of providing a set of resin R3 on the mold 10 after the mold 10 has been rotated by 90 degrees or with the resin R3 being provided at a 90-degree angle with respect to the previously provided resin R1 in a method for manufacturing a wire grid polarizer according to an embodiment of the present invention, and FIG. 10 is a schematic cross-sectional view taken along a line IX-IX indicated in FIG. 9 according to an embodiment of the present invention.

Referring to FIG. 3 and FIG. 9, the mold 10 may be rotated by a predetermined angle about the circular center of the mold 10. The angle may be set to, for example, 90°. The resin R3 is provided (e.g., spread) on the pattern of the mold 10, i.e., on the protrusions 10a and trenches 10b of the mold 10. The orientation of the resin R3 may be substantially identical to the orientation of the previously provided resin R1. The resin R3 may have a substantially rectangular shape in the plan view of the structure that includes the mold 10 and the resin R3. An area of the resin R3 in the plan view may be substantially equal to a planar area of the display region of the display panel, a planar area of the first substrate 101, or a planar area of the second substrate 201, wherein the display panel including the substrates 101 and 201 are illustrated in FIG. 1. The mold 10 may be positioned according to a second orientation, wherein the protrusions 10a (and the trenches 10b) may be oriented parallel to a longer side of the resin R3 in the plan view.

In an embodiment, the mold 10 may remain in the first orientation, and the resin R3 may have an orientation that is at a 90-degree angle with respect to the orientation of the previously provided resin R1. As a result, the protrusions 10a (and the trenches 10b) may be oriented parallel to a longer side of the resin R3 in a plan view of a structure that includes the mold 10 and the resin R3.

Figure 11:
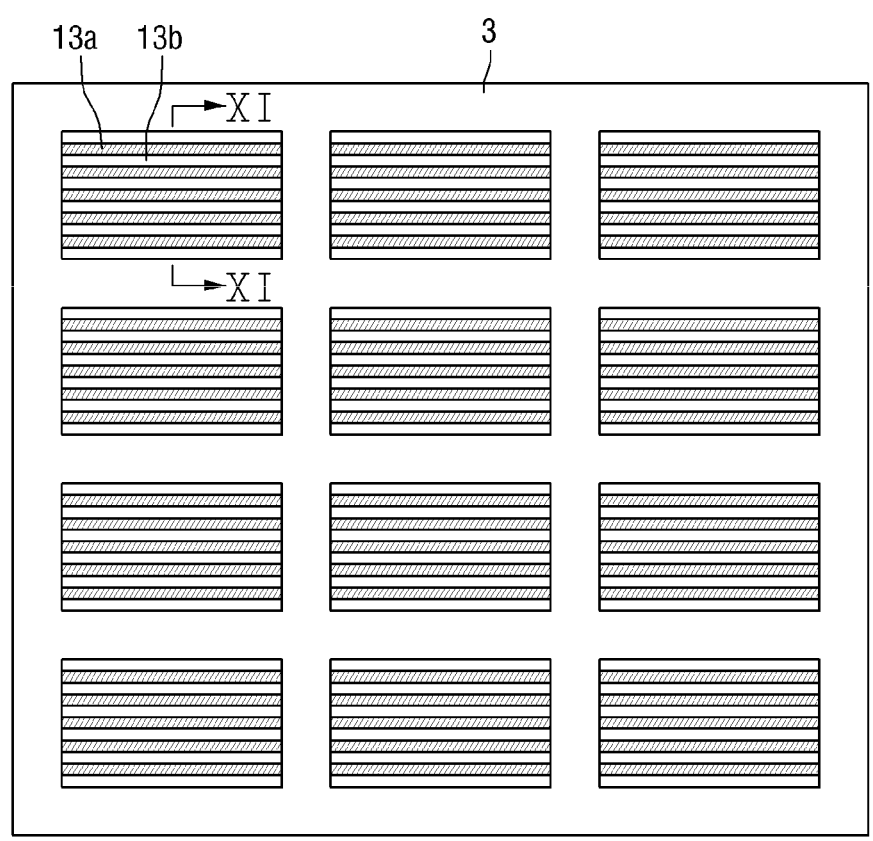
FIG. 11 is a schematic plan view illustrating a film stamp to which a pattern illustrated in FIG. 10 is transferred according to an embodiment of the present invention.
Figure 12:
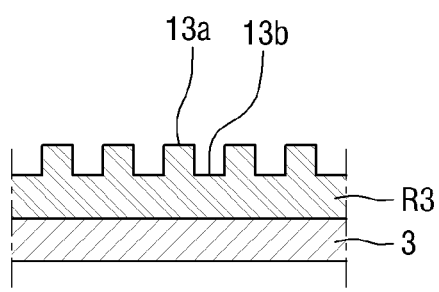
FIG. 12 is a schematic cross-sectional view taken along a line XI-XI indicated in FIG. 11 according to an embodiment of the present invention.

FIG. 11 is a schematic plan view illustrating a film stamp to which a pattern illustrated in FIG. 10 is transferred according to an embodiment of the present invention, and FIG. 12 is a schematic cross-sectional view taken along line XI-XI indicated in FIG. 11 according to an embodiment of the present invention.

Referring to FIGS. 9, 10, 11, and 12, the mold 10 may shape the resin R3 to have protrusions 13a and trench 13b, and the resin R3 may be provided on a film 3 to form a film stamp that includes the resin R3 and the film 3. The steps associated with FIGS. 9, 10, 11, and 12 may be analogous to the steps associated with FIGS. 3, 4, 5, and 6.

Figure 13:
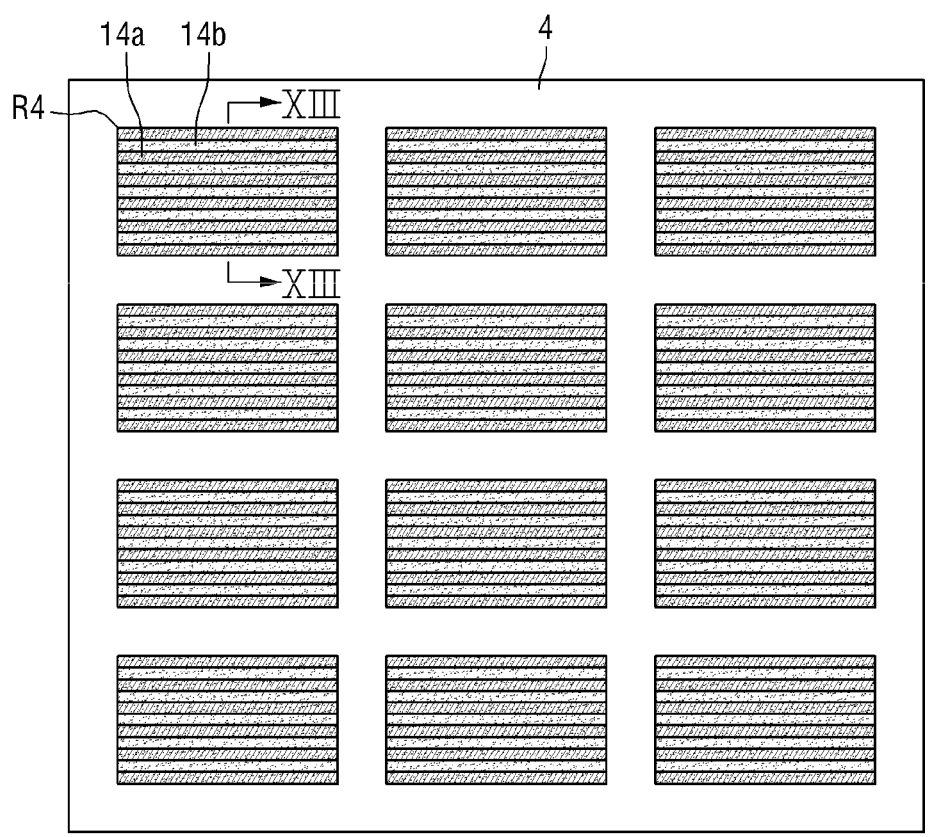
FIG. 13 is a schematic plan view illustrating a mother substrate that is imprinted by the film stamp illustrated in FIG. 11 according to an embodiment of the present invention.
Figure 14:
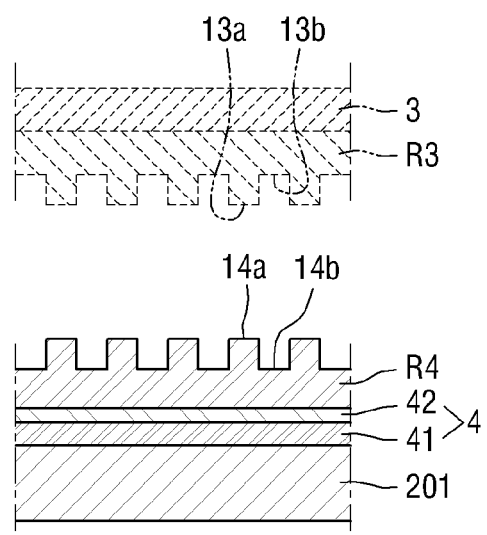
FIG. 14 is a schematic cross-sectional view taken along a line XIII-XIII indicated in FIG. 13 according to an embodiment of the present invention.

FIG. 13 is a schematic plan view illustrating a mother substrate that is imprinted by the film stamp illustrated in FIG. 11 according to an embodiment of the present invention, and FIG. 14 is a schematic cross-sectional view taken along a line XIII-XIII indicated in FIG. 13 according to an embodiment of the present invention.

Referring to FIGS. 13 and 14, a set of resin R4 is provided (e.g., spread) on each of a plurality of regions on a mother substrate 4. Each set of resin R4 may have a rectangular shape in a plan view and may correspond to a display region a display panel. Sets of resin R4 are spaced from each other at predetermined intervals. Thereafter, by imprinting the film stamp that includes sets of cured resin R3 onto the mother substrate 4, patterns that replicate the pattern of the mold 10 are transferred to the sets of resin R4, which are positioned at display regions of display panels. As a result, each set of resin R4 may include protrusions 14a and trenches 14b. The shapes and dimensions of the protrusions 14a may be determined by the trenches 13b of the corresponding set of resin R3, and the shapes and dimensions of the trenches 14b may be determined by the protrusions 13a of the corresponding set of resin R3. The shape and area of each set of resin R4 may be substantially identical and equal to the shape and area of a corresponding set of cured set or resin R3 in a plan view of a structure that includes the sets of resins R3 and R4.

Referring to FIG. 14, the mother substrate 4 may include a metal thin film 41. The metal thin film 41 may be deposed on a glass substrate 201. The resin R4 may be spread on the metal thin film 41. The material of the resin R4 may include at least one of a thermosetting resin and a UV curable resin. The resin R4 may be cured. By performing etching on the metal thin film 41 using the cured resin R4 as a mask, metal wires may be formed, and wire grid polarizers may be manufactured. In an embodiment, a hard mask layer 42 may be provided between the metal thin film 41 and the resin R4 to form a composite mask that has a desirable etch resistance, in order to achieve an optimal etching result.

A wire grid polarizer manufactured using steps discussed with reference FIGS. 3, 4, 5, 6, 7, and 8 may function as the polarizer 110 illustrated in FIG. 1. A wire grid polarizer manufactured using steps discussed with reference FIGS. 9, 10, 11, 12, 13, and 14 may function as the polarizer 210 illustrated in FIG. 1.

A first side of the cured resin R1 may be longer than a second side of the cured resin R1 in a plan view of the cured resin R1. A length of the first side of the cured resin R1 may be equal to a length of a wire of the wires of the polarizer 210. A first side of the cured resin R3 may be longer than a second side of the cured resin R3 in a plan view of the cured resin R3. A length of the second side of the cured resin R3 may be equal to a length of a wire of the wires of the polarizer 110.

Although the wire grid pattern of the polarizer 110 is substantially different from the wire grid pattern of the polarizer 210, the mold 10 may be used for manufacturing both the polarizer 110 and the polarizer 210. Advantageously, manufacturing costs associated with the polarizers 110 and 210 may be minimized.

Figure 15:
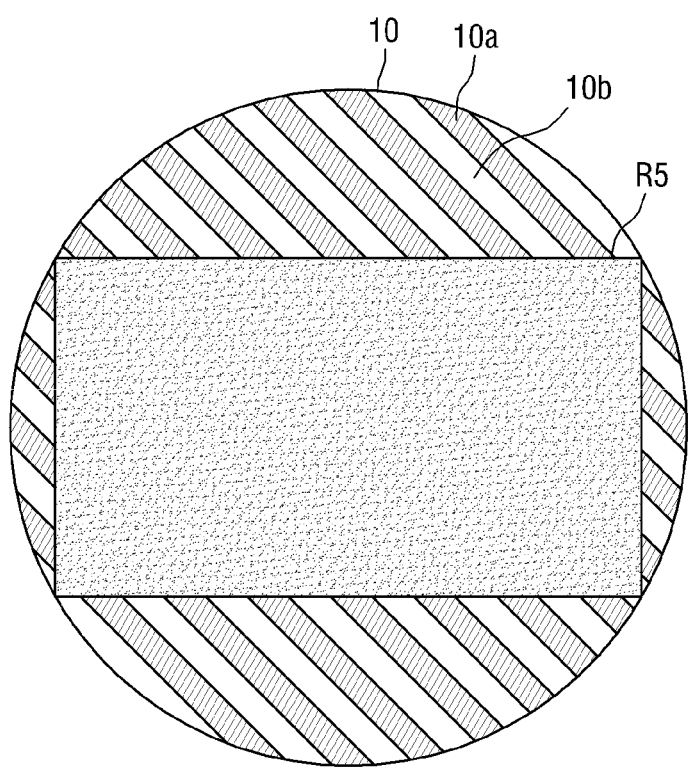
FIG. 15 is a schematic plan view illustrating a step of providing a set of resin on a mold such that a side of the resin is oriented at a first obtuse or acute angle with respect to protrusions (and trenches) of the mold in a method for manufacturing a wire grid polarizer according to an embodiment of the present invention.
Figure 16:
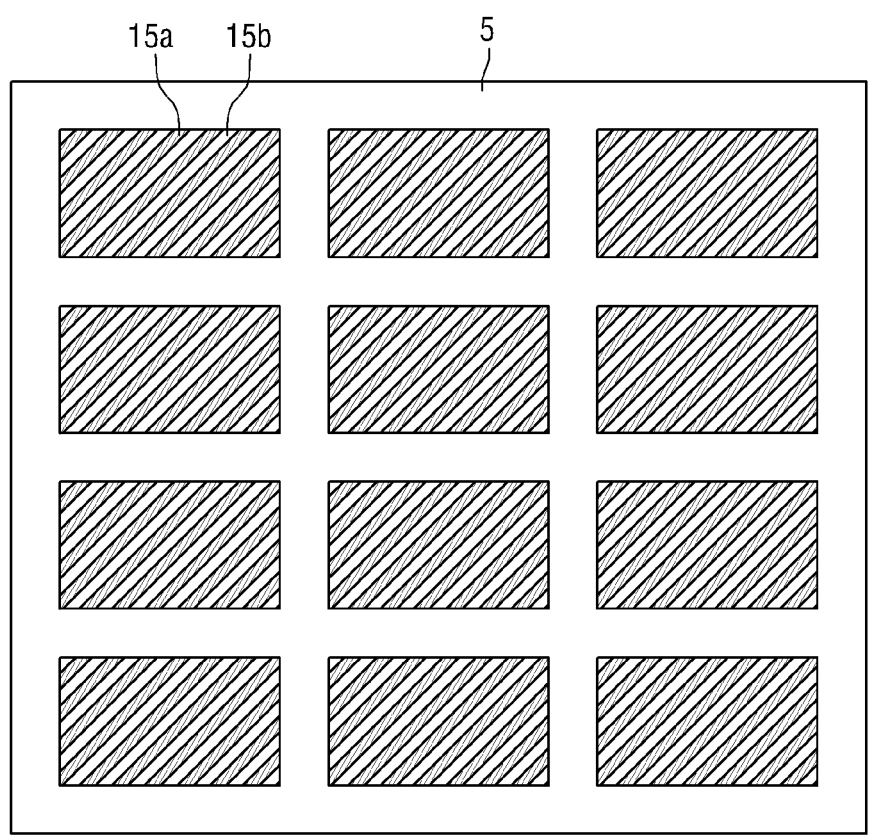
FIG. 16 is a schematic plan view illustrating a film stamp to which a pattern illustrated in FIG. 15 is transferred according to an embodiment of the present invention.

FIG. 15 is a schematic plan view illustrating a step of providing a set of resin R5 on the mold 10 such that a side of the resin R5 is oriented at a first obtuse or acute angle with respect to protrusions 10a (and trenches 10b) of the mold 10 in a method for manufacturing a wire grid polarizer according to an embodiment of the present invention, and FIG. 16 is a schematic plan view illustrating a film stamp to which a pattern illustrated in FIG. 15 is transferred according to an embodiment of the present invention. In an embodiment, the first obtuse or acute angle may be 45 degrees.

Steps associated with FIG. 15 and FIG. 16 for manufacturing wire grid polarizers may be substantially analogous to the steps discussed with reference to FIGS. 3, 4, 5, and 6. The mold 10 may pattern the resin R5 to have protrusions 15a and trenches 15b, and the patterned resin R5 may be provide on a film 5 to form a film stamp.

Figure 17:
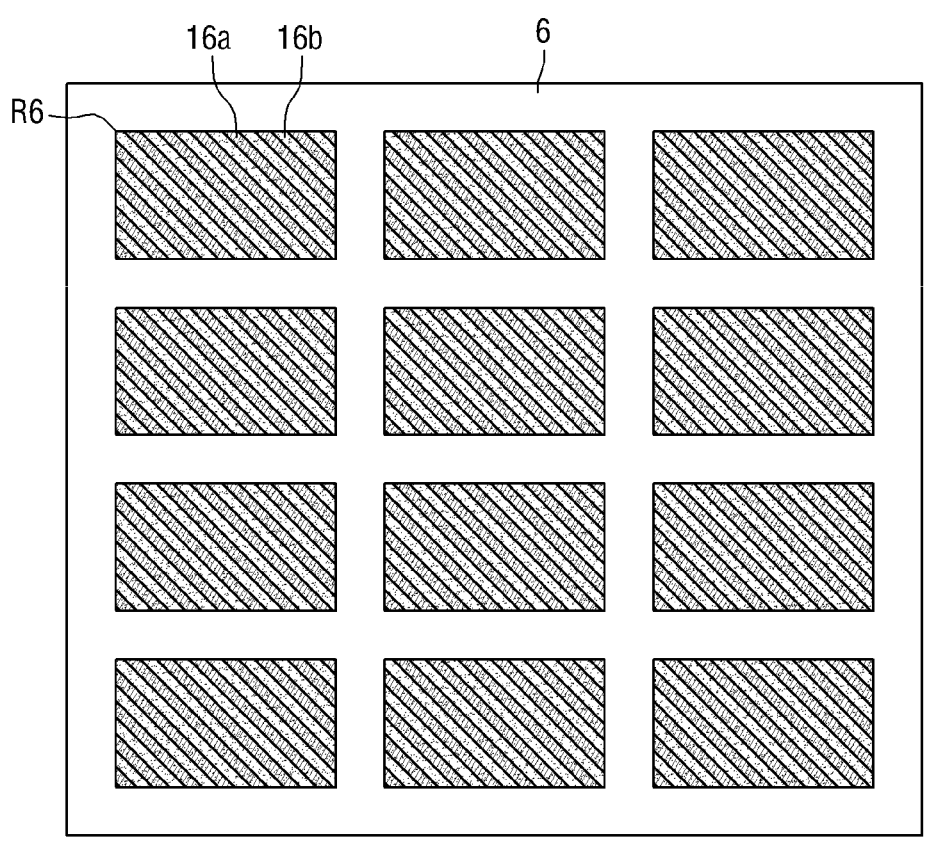
FIG. 17 is a schematic plan view illustrating a mother substrate that is imprinted by the film stamp illustrated in FIG. 16 according to an embodiment of the present invention.

FIG. 17 is a schematic plan view illustrating a mother substrate 6 that is imprinted by the film stamp illustrated in FIG. 16 according to an embodiment of the present invention.

Steps associated with FIG. 15, FIG. 16, and FIG. 17 for manufacturing wire grid polarizers may be substantially analogous to the steps discussed with reference to FIGS. 3, 4, 5, 6, 7, and 8. Referring to FIG. 17, a set of resin R6 is provided (e.g., spread) on each of a plurality of regions on the mother substrate 6. The regions may be arranged in an array that has rows and columns and are spaced from each other. Each set of resin R6 may have a rectangular shape in a plan view and may correspond to a display region of a display panel. Sets of resin R6 are spaced from each other at predetermined intervals. Subsequently, by imprinting the film stamp that includes sets of cured resin R5 onto the mother substrate 6, patterns that replicate the pattern of the mold 10 are transferred to the sets of resin R6, which are positioned at display regions of display panels. As a result, each set of resin R6 may include protrusions 16a and trenches 16b. The shapes and dimensions of the protrusions 16a may be determined by the trenches 15b of the corresponding set of resin R5, and the shapes and dimensions of the trenches 16b may be determined by the protrusions 15a of the corresponding set of resin R5. The shape and area of each set of resin R6 may be substantially identical and equal to the shape and area of a corresponding set of cured set or resin R5 in a plan view of a structure that includes the sets of resins R5 and R6. An etching process may be performed using the sets of resin R6 as masks for etching a metal film to form wires of a first set of wire grid polarizers.

Figure 18:
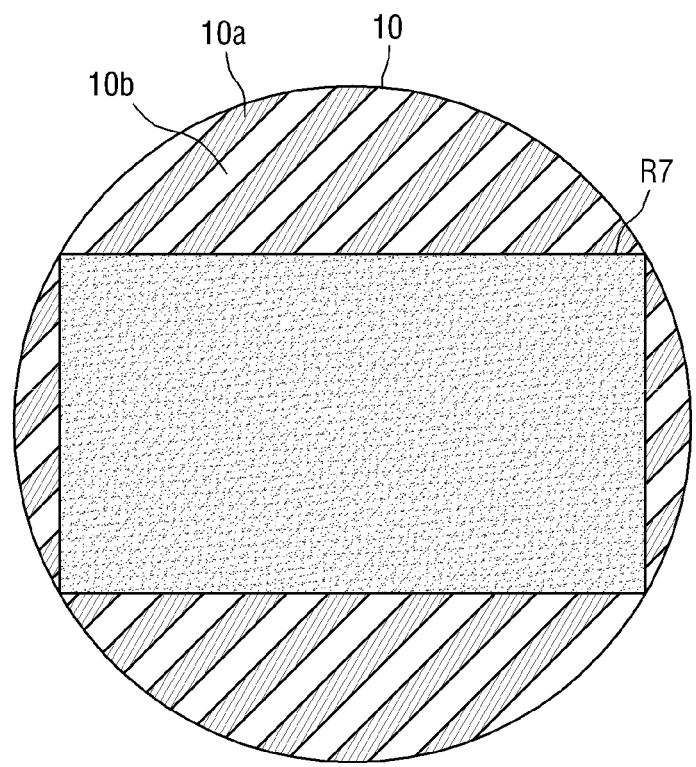
FIG. 18 is a schematic plan view illustrating a step of providing a set of resin on a mold such that a side of the resin is oriented at a second obtuse or acute angle with respect to protrusions (and trenches) of the mold in a method for manufacturing a wire grid polarizer according to an embodiment of the present invention.
Figure 19:
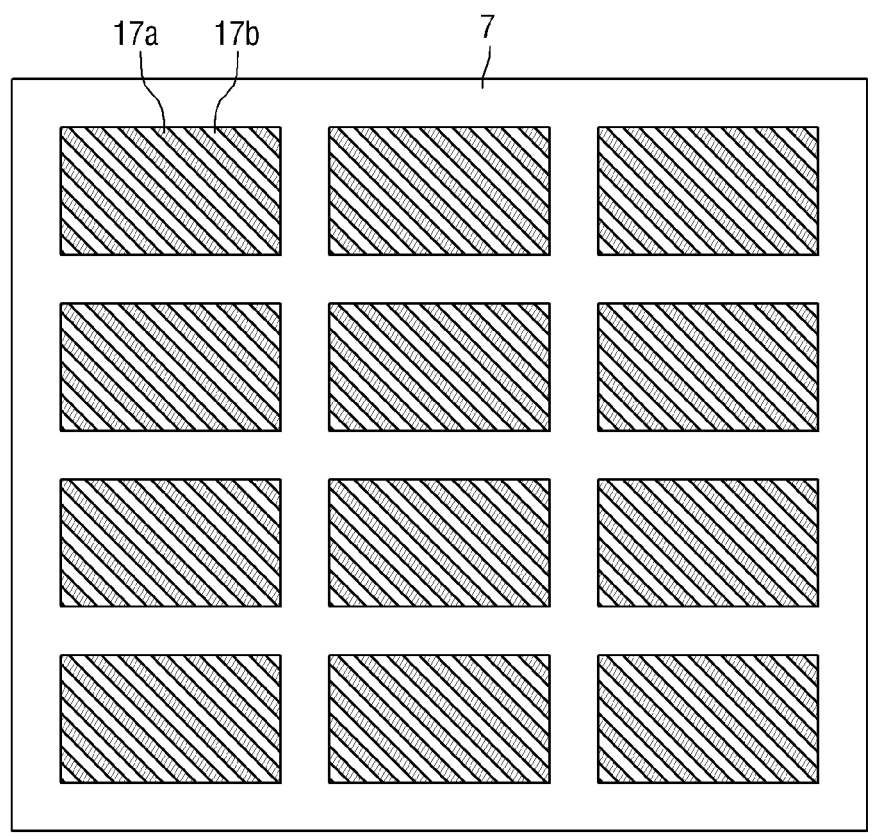
FIG. 19 is a schematic plan view illustrating a film stamp to which a pattern illustrated in FIG. 18 is transferred according to an embodiment of the present invention.
Figure 20:
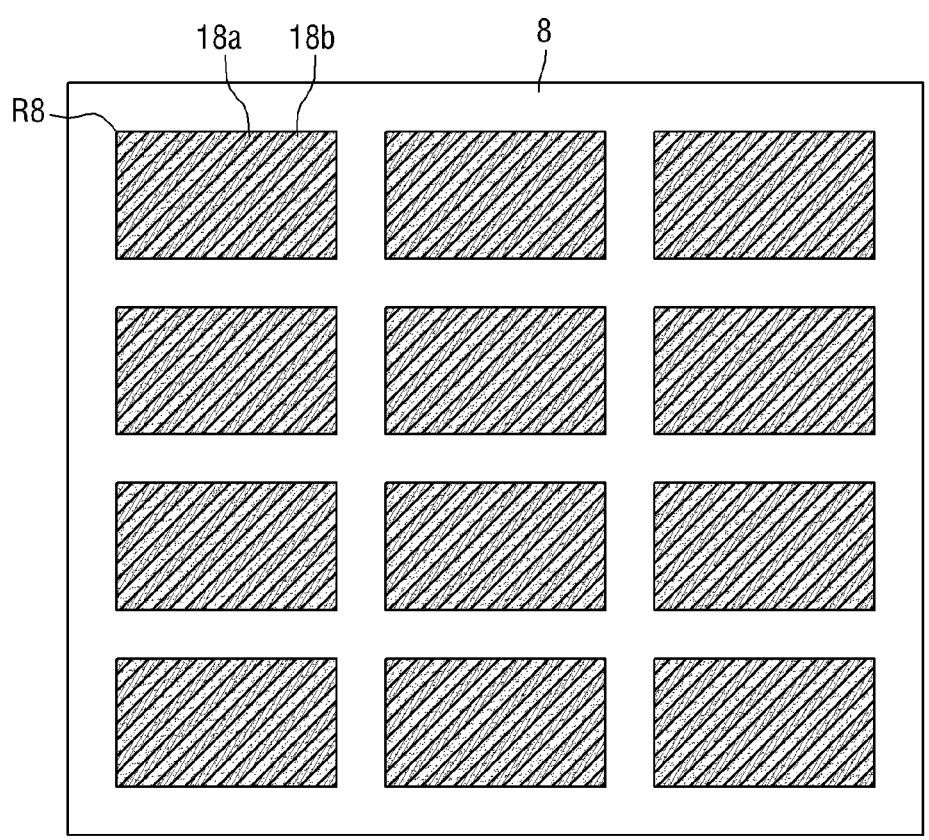
FIG. 20 is a schematic plan view illustrating a mother substrate that is imprinted by the film stamp illustrated in FIG. 19 according to an embodiment of the present invention.

FIG. 18 is a plan view illustrating a step of providing a set of resin R7 on the mold 10 such that a side of the resin R7 is oriented at a second obtuse or acute angle with respect to the protrusions 10a (and the trenches 10b) of the mold 10 in a method for manufacturing a wire grid polarizer according to an embodiment of the present invention. FIG. 19 is a schematic plan view illustrating a film stamp to which a pattern illustrated in FIG. 18 is transferred according to an embodiment of the present invention. FIG. 20 is a schematic plan view illustrating a mother substrate 8 that is imprinted by the film stamp illustrated in FIG. 19 according to an embodiment of the present invention. In an embodiment, the difference between the second obtuse or acute angle and the first obtuse or acute angle may be 90 degrees. In an embodiment, the second obtuse or acute angle may be 135 degrees.

Steps associated with FIG. 18, FIG. 19, and FIG. 20 for manufacturing wire grid polarizers may be substantially analogous to the steps discussed with reference to FIGS. 9, 10, 11, 12, 13, and 14. Referring to FIG. 18 and FIG. 19, the mold 10 may pattern the resin R7 to have protrusions 17a and trenches 17b, and the patterned resin R7 may be provide on a film 7 to form a film stamp. Referring to FIG. 20, a set of resin R8 is provided (e.g., spread) on each of a plurality of regions on the mother substrate 8. The regions may be arranged in an array that has rows and columns and are spaced from each other. Each set of resin R8 may have a rectangular shape in a plan view and may correspond to a display region of a display panel. Sets of resin R8 are spaced from each other at predetermined intervals. Subsequently, by imprinting the film stamp that includes sets of cured resin R7 onto the mother substrate 8, patterns that replicate the pattern of the mold 10 are transferred to the sets of resin R8, which are positioned at display regions of display panels. As a result, each set of resin R8 may include protrusions 18a and trenches 18b. The shapes and dimensions of the protrusions 18a may be determined by the trenches 17b of the corresponding set of resin R7, and the shapes and dimensions of the trenches 18b may be determined by the protrusions 17a of the corresponding set of resin R7. The shape and area of each set of resin R8 may be substantially identical and equal to the shape and area of a corresponding set of cured set or resin R7 in a plan view of a structure that includes the sets of resins R7 and R8. An etching process may be performed using the sets of resin R8 as masks for etching a metal film to form wires of a second set of wire grid polarizers. One of the first set of wire grid polarizers and one of the second set of wire grid polarizers may be used in a display panel and may overlap each other.

A first side of the cured resin R5 may be longer than a second side of the cured resin R5 in a plan view of the cured resin R5. A wire of the wires of a wire grid polarizer of the second wire grid polarizer may be shorter than the first side of the cured resin R5 and may be longer than the second side of the cured resin R5.

The same mold 10 may be used for manufacturing both the first set of wire grid polarizers and the second set of wire grid polarizers. Advantageously, manufacturing costs associated with the first set of wire grid polarizers and the second set of wire grid polarizers may be minimized.

Although embodiments of the present invention have been described for illustrative purposes, those skilled in the art will appreciate that various modifications, additions, and substitutions are possible, without departing from the scope and spirit of the invention.

What is claimed is:

1. A method for manufacturing at least one stamp, the method comprising:
    preparing a mold that includes mold protrusions, wherein the mold protrusions extend parallel to each other in a plan view of the mold and include a first mold protrusion;
    providing first resin on the mold, wherein the first resin partially covers the mold protrusions without completely covering the mold protrusions, and wherein a first side of the first resin is at a first angle with respect to the first mold protrusion in a plan view of a structure that includes the mold and the first resin;
    curing the first resin to form first cured resin;
    forming a first stamp that includes the first cured resin;
    providing second resin on the mold, wherein the second resin partially covers the mold protrusions without completely covering the mold protrusions, wherein a first side of the second resin is at a second angle with respect to the first mold protrusion in a plan view of a structure that includes the mold and the second resin, and wherein the second angle is unequal to the first angle;
    curing the second resin to form second cured resin;
    forming a second stamp that includes the second cured resin; and
    rotating the mold before providing the second resin on the mold.
2. The method of claim 1, wherein the first side of the first resin is longer than a second side of the first resin in a plan view of the first resin, and wherein the first side of the second resin is longer than a second side of the second resin in a plan view of the second resin.
3. The method of claim 1, wherein an area of the first cured resin in a plan view of the first cured resin is equal to an area of the second cured resin in a plan view of the second cured resin.
4. The method of claim 1, wherein a difference between the second angle and the first angle is equal to 90 degrees.
5. The method of claim 1, wherein the first angle is an acute angle, and wherein the second angle is an obtuse angle.
6. The method of claim 1, wherein the first angle is an acute angle or an obtuse angle.
7. The method of claim 1, wherein the first resin is positioned between two portions of the first mold protrusion in the plan view of the structure that includes the mold and the first resin.
8. The method of claim 1, wherein the first resin is positioned between two arcs of the mold in a plan view of a structure that includes the mold and the first resin.
9. A method for manufacturing at least one wire grid polarizer, the method comprising:
    preparing a mold that includes mold protrusions, wherein the mold protrusions extend parallel to each other in a plan view of the mold and include a first mold protrusion;
    providing first resin on the mold, wherein the first resin partially covers the mold protrusions without completely covering the mold protrusions, and wherein a first side of the first resin is at a first angle with respect to the first mold protrusion in a plan view of a structure that includes the mold and the first resin;
    curing the first resin to form first cured resin;
    forming a first stamp that includes the first cured resin;
    pressing the first stamp on first mask material for forming a first mask;
    etching a first metal film through the first mask to form wires of a first wire grid polarizer;
    providing second resin on the mold, wherein the second resin partially covers the mold protrusions without completely covering the mold protrusions, wherein a first side of the second resin is at a second angle with respect to the first mold protrusion in a plan view of a structure that includes the mold and the second resin, and wherein the second angle is unequal to the first angle;
    curing the second resin to form second cured resin;
    forming a second stamp that includes the second cured resin;
    pressing the second stamp on second mask material for forming a second mask; and
    etching a second metal film through the second mask to form wires of a second wire grid polarizer; and
    rotating the mold before providing the second resin on the mold.
10. The method of claim 9, wherein the first side of the first resin is longer than a second side of the first resin in a plan view of the first resin, and wherein the first side of the second resin is longer than a second side of the second resin in a plan view of the second resin.
11. The method of claim 10, wherein a length of a wire of the wires of the second wire grid polarizer is substantially equal to a length of the first side of the first resin.
12. The method of claim 9, wherein a first side of the first cured resin is longer than a second side of the first cured resin in a plan view of the first cured resin, wherein a length of the first side of the first cured resin is equal to a length of a wire of the wires of the second wire grid polarizer, wherein a first side of the second cured resin is longer than a second side of the second cured resin in a plan view of the second cured resin, and wherein a length of the second side of the second cured resin is equal to a length of a wire of the wires of the first wire grid polarizer.

13. The method of claim 9, wherein a first side of the first cured resin is longer than a second side of the first cured resin in a plan view of the first cured resin, and wherein a wire of the wires of the second wire grid polarizer is shorter than the first side of the first cured resin and is longer than the second side of the first cured resin.

14. The method of claim 9, wherein the mold includes a silicon member.

15. The method of claim 9, wherein the first resin is positioned between two arcs of the first mold protrusion in the plan view of the structure that includes the mold and the first resin.

16. The method of claim 9, wherein the first mask includes the first mask material and a resistance layer, and wherein the resistance layer is positioned between the first mask material and the first metal film.

* * * * *